(12) United States Patent
Yoshimizu et al.

(10) Patent No.: US 11,784,064 B2
(45) Date of Patent: Oct. 10, 2023

(54) SUBSTRATE TREATMENT APPARATUS AND MANUFACTURING METHOD OF SEMICONDUCTOR DEVICE

(71) Applicant: Kioxia Corporation, Tokyo (JP)

(72) Inventors: Yasuhito Yoshimizu, Mie (JP); Yuya Akeboshi, Mie (JP); Fuyuma Ito, Mie (JP); Hakuba Kitagawa, Mie (JP)

(73) Assignee: Kioxia Corporation, Tokyo (JP)

( * ) Notice: Subject to any disclaimer, the term of this patent is extended or adjusted under 35 U.S.C. 154(b) by 17 days.

(21) Appl. No.: 16/950,389

(22) Filed: Nov. 17, 2020

(65) Prior Publication Data

US 2021/0090913 A1 Mar. 25, 2021

Related U.S. Application Data

(60) Division of application No. 15/920,956, filed on Mar. 14, 2018, now Pat. No. 10,879,087, which is a (Continued)

(30) Foreign Application Priority Data

Mar. 17, 2017 (JP) .................................. 2017-053310
Sep. 26, 2017 (JP) .................................. 2017-185305
Mar. 9, 2018 (JP) .................................. 2018-043388

(51) Int. Cl.
*H01L 21/67* (2006.01)
*H01L 21/3213* (2006.01)
*H01L 21/311* (2006.01)

(52) U.S. Cl.
CPC .. *H01L 21/67075* (2013.01); *H01L 21/31144* (2013.01); *H01L 21/32134* (2013.01); (Continued)

(58) Field of Classification Search
None
See application file for complete search history.

(56) References Cited

U.S. PATENT DOCUMENTS 4,239,502 A * 12/1980 Slack ....................... B24D 3/06
257/782
5,858,109 A 1/1999 Hymes et al.
(Continued)

FOREIGN PATENT DOCUMENTS

CN 106256016 A 12/2016
JP H02-109333 4/1990
(Continued)

OTHER PUBLICATIONS

Machine Generated English Translation bib data of WO2015159973. published Oct. 22, 2015. (Year: 2015).*
(Continued)

*Primary Examiner* — Sylvia MacArthur
(74) *Attorney, Agent, or Firm* — Oblon, McClelland, Maier & Neustadt, L.L.P.

(57) ABSTRACT

According to an embodiment, a substrate treatment apparatus includes a hair member including a noble metal, and a liquid chemical supply member to supply a liquid chemical. While a tip part of the hair member is contact with a predetermined surface of a metal, the liquid chemical is supplied onto the surface of the metal, and the metal is removed with etching.

11 Claims, 17 Drawing Sheets

Related U.S. Application Data continuation-in-part of application No. 15/700,694, filed on Sep. 11, 2017, now abandoned.

(52) U.S. Cl.
CPC .... *H01L 21/32139* (2013.01); *H01L 21/6708* (2013.01); *H01L 21/67046* (2013.01); *H01L 21/67086* (2013.01)

(56) References Cited

U.S. PATENT DOCUMENTS

| | | | | |
|---|---|---|---|---|
| 6,120,616 | A * | 9/2000 | Bahten | B08B 3/08 134/28 |
| 6,383,065 | B1 | 5/2002 | Grumbine et al. | |
| 6,676,492 | B2 * | 1/2004 | Li | C09G 1/02 451/65 |
| 6,858,091 | B2 * | 2/2005 | Boyd | H01L 21/02074 134/32 |
| 7,651,625 | B2 * | 1/2010 | Yamauchi | C23F 1/30 205/640 |
| 8,513,139 | B2 | 8/2013 | Matsuda et al. | |
| 8,747,189 | B2 * | 6/2014 | David | H01L 21/304 451/4 |
| 8,912,095 | B2 | 12/2014 | Sano et al. | |
| 8,936,729 | B2 | 1/2015 | Gawase et al. | |
| 9,144,879 | B2 | 9/2015 | Gawase et al. | |
| 9,233,449 | B2 | 1/2016 | Sano et al. | |
| 9,966,306 | B2 | 5/2018 | Inatomi et al. | |
| 10,665,487 | B2 | 5/2020 | Kobata et al. | |
| 2003/0006147 | A1 * | 1/2003 | Talieh | C25D 5/06 205/640 |
| 2003/0089615 | A1 | 5/2003 | Basol | |
| 2005/0133379 | A1 * | 6/2005 | Basol | B24B 37/20 205/652 |
| 2007/0099549 | A1 * | 5/2007 | Palushaj | A46B 13/02 451/526 |
| 2012/0024317 | A1 | 2/2012 | Kitamura et al. | |
| 2013/0037055 | A1 | 2/2013 | Yoshimizu | |
| 2014/0073069 | A1 | 3/2014 | Takami et al. | |
| 2015/0370160 | A1 * | 12/2015 | Yamada | C03C 23/0075 430/5 |
| 2016/0126133 | A1 * | 5/2016 | Li | H01L 21/76898 438/667 |
| 2017/0047237 | A1 | 2/2017 | Kobata et al. | |
| 2018/0269082 | A1 | 9/2018 | Yoshimizu | |
| 2021/0090913 | A1 * | 3/2021 | Yoshimizu | H01L 21/67086 |

FOREIGN PATENT DOCUMENTS

| | | | |
|---|---|---|---|
| JP | H07-74132 | 3/1995 | |
| JP | 3093872 | 7/2000 | |
| JP | 2002-353191 | 12/2002 | |
| JP | 2004-31791 | 1/2004 | |
| JP | 2004-111668 | 4/2004 | |
| JP | 2006-210778 | 8/2006 | |
| JP | 2007518577 A * | 7/2007 | |
| JP | 2008-81389 | 4/2008 | |
| JP | 4551229 | 7/2010 | |
| JP | 4611611 | 10/2010 | |
| JP | 2011-129596 | 6/2011 | |
| JP | 2012-28697 | 2/2012 | |
| JP | 2012-80128 | 4/2012 | |
| JP | 2013-131566 | 7/2013 | |
| JP | 2014-53456 | 3/2014 | |
| JP | WO 2014/104009 A1 | 7/2014 | |
| JP | 2014-154608 | 8/2014 | |
| JP | 2016-72441 | 5/2016 | |
| JP | 2016-156038 A | 9/2016 | |
| WO | WO 2015/159973 A1 | 10/2015 | |
| WO | WO-2015159973 A1 * | 10/2015 | B24B 37/04 |

OTHER PUBLICATIONS

Machine Generated English Translation of description of WO2015159973. published Oct. 22, 2015. (Year: 2015).*

* cited by examiner

US 11,784,064 B2

SUBSTRATE TREATMENT APPARATUS AND MANUFACTURING METHOD OF SEMICONDUCTOR DEVICE

CROSS-REFERENCE TO RELATED APPLICATIONS

This application is a Divisional of U.S. application Ser. No. 15/920,956 filed Mar. 14, 2018, and which is a continuation-in-part application of Ser. No. 15/700,694 filed on Sep. 11, 2017 and also based upon and claims the benefit of priority from Japanese Patent Applications No. 2017-053310 filed on Mar. 17, 2017, No. 2017-185305 filed on Sep. 26, 2017, and No. 2018-043388 filed on Mar. 9, 2018; the entire contents of these applications are incorporated herein by reference.

FIELD

Embodiments of the present invention relate to a substrate treatment apparatus and a manufacturing method of semiconductor device.

BACKGROUND

In one of substrate treatment methods, there is included an etching removing a metal film formed on a substrate.

A problem to be solved by the present invention is to provide a substrate treatment apparatus and a manufacturing method of semiconductor device suitable for enhancing an etching rate of a metal film.

DETAILED DESCRIPTION

Embodiments will now be explained with reference to the accompanying drawings. The present invention is not limited to the embodiments.

First Embodiment

Figure 1:
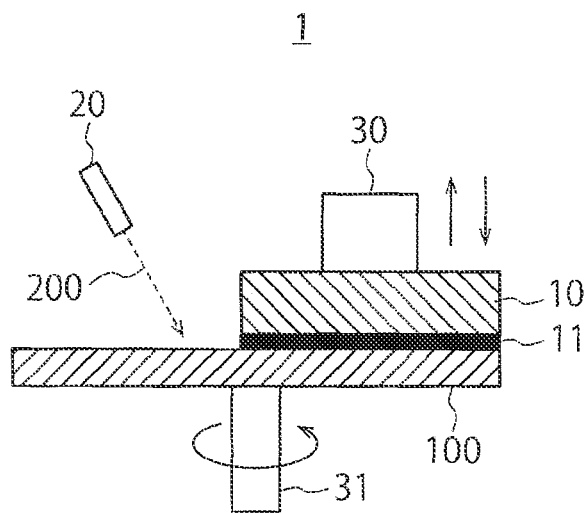
FIG. 1 is a schematic diagram showing a schematic configuration of a substrate treatment apparatus according to a first embodiment.

FIG. 1 is a schematic diagram showing a schematic configuration of a substrate treatment apparatus according to a first embodiment. A substrate treatment apparatus 1 shown in FIG. 1 is a treatment apparatus for a substrate 100 and includes a noble metal-containing member 10, a liquid chemical supply nozzle 20 (liquid chemical supply member), a retention member 30 (first retention member) and a retention member 31 (second retention member).

Figure 2:
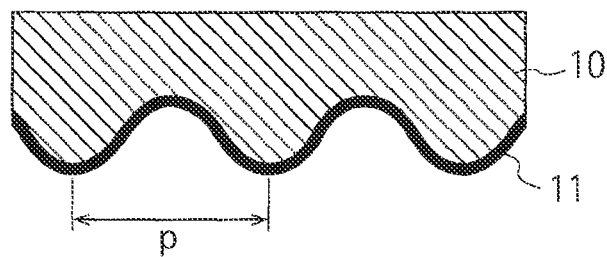
FIG. 2 is an expanded view having a part of the bottom face of a noble metal-containing member expanded.

FIG. 2 is an expanded view having a part of the bottom face of the noble metal-containing member 10 expanded. In the present embodiment, the noble metal-containing member 10 is constituted of a porous member, for example, made of polyvinyl alcohol (PVA), urethane, Teflon® or an ion exchange resin. As shown in FIG. 2, the bottom face of the noble metal-containing member 10 is formed into a concave-convex surface. When a pitch p between convex portions on this concave-convex surface is too narrow, a liquid chemical 200 hardly comes into the concave-convex surface. On the other hand, when the pitch p is too wide, it is concerned that contact between the noble metal-containing member 10 and the substrate 100 is insufficient. Therefore, the pitch p preferably falls within a range of tens of micrometers. Moreover, when the height of the concave-convex surface is too low, the liquid chemical 200 hardly comes into the concave-convex surface. Therefore, the height is preferably not less than tens of micrometers.

A noble metal film 11 that comes into partial contact with the substrate 100 is provided on the aforementioned concave-convex surface. The noble metal film 11 preferably includes, for example, at least any of platinum (Pt), gold (Au), silver (Ag) and palladium (Pd). Moreover, the noble metal film 11 is formed on the aforementioned concave-convex surface, for example, by a sputtering method, an electroless plating method, a CVD (Chemical Vapor Deposition) method, an ALD (Atomic Layer Deposition) method or the like. When the noble metal film 11 is formed by the electroless plating method, an ion exchange resin is preferably used for the noble metal-containing member 10 in order to enhance adhesion to the noble metal film 11. Moreover, when the noble metal film 11 is formed on a porous member using Teflon® by the sputtering method, by beforehand performing plasma processing on the surface of Teflon®, adhesion to the noble metal film 11 can be enhanced while maintaining durability to the liquid chemical 200.

Returning to FIG. 1, in the present embodiment, the liquid chemical supply nozzle 20 includes a nozzle that ejects the liquid chemical 200 which is alkaline toward a contact portion between the substrate 100 and the aforementioned noble metal film 11, The liquid chemical 200 is preferably a mixed solution of an alkaline solution and an oxidizing agent. For the alkaline solution, for example, choline, aqueous ammonia and sodium hydroxide can be used. Meanwhile, for the oxidizing agent, for example, aqueous hydrogen peroxide and aqueous ozone can be used. Notably, in order to enhance an etching effect, the temperature of the liquid chemical 200 supplied from the liquid chemical supply nozzle 20 is preferably close to 80° C. It should be noted that the liquid chemical 200 is not limited to be alkaline but may be acidic in accordance with a component included in the noble metal film 11 to be etched.

The retention member 30 elevatably retains the noble metal-containing member 10. The retention member 30 is joined, for example, to an elevation mechanism or constituted as a part of the elevation mechanism.

The retention member 31 rotably retains the substrate 100. The retention member 31 is joined, for example, to a rotation mechanism or constituted as a part of a rotary shaft of the rotation mechanism.

Figure 3A:
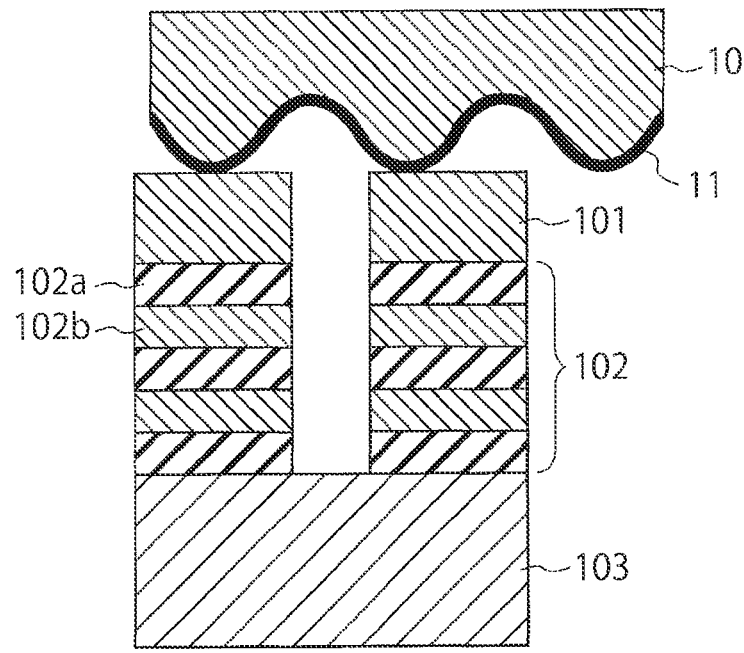
FIG. 3A is a cross-sectional view showing a state before etching of a substrate.
Figure 3B:
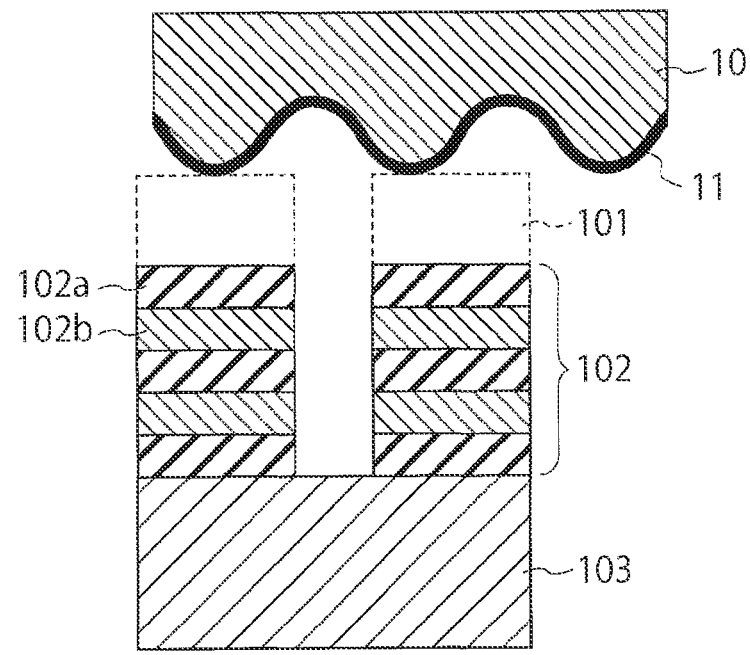
FIG. 3B is a cross-sectional view showing a state after the etching of the substrate.

Next, referring to FIG. 3A and FIG. 3B, a structure of the substrate 100 which is an etching target is described. FIG. 3A shows a state of the substrate 100 before etching. FIG. 3B shows a state of the substrate 100 after the etching.

As shown in FIG. 3A, a metal film 101 is provided in the substrate 100 before etching. The metal film 101 is on a stacked body 102. The stacked body 102 is on a semiconductor substrate including a silicon, etc. The metal film 101 is a mask formed on the stacked body 102 for forming a pattern (in the present embodiment, a slit penetrating the stacked body 102) in the stacked body 102 and includes, for example, tungsten. In the present embodiment, the pattern of the stacked body 102 is formed by etching with a pattern formed on the metal film 101 as a mask, for example. As shown in FIG. 3B, this metal film 101 is removed with etching by the substrate treatment apparatus 1. In the present embodiment, the substrate 100 includes the stacked body 102, in other words, the substrate 100 is a semiconductor device including the stacked body 102 on which the pattern is formed.

In the stacked body 102, insulator films 102a and conductor films 102b are alternately provided. The insulator films 102a include, for example, silicon oxide ($SiO_2$). The conductor films 102b include tungsten the same as the metal film 101. The conductor films 102b can be used, for example, for word lines of a three-dimensional memory. Notably, the structure of the substrate 100 is not limited to the aforementioned structure but may be any structure in which some pattern is formed.

Hereafter, a substrate treatment method using the substrate treatment apparatus 1 according to the present embodiment is described. Herein, an etching step of the substrate 100 is described.

First, as shown in FIG. 1, by moving down the noble metal-containing member 10 using the retention member 30 with respect to the substrate 100 retained on the retention member 31, the noble metal film 11 of the noble metal-containing member 10 is contact with the metal film 101 of the substrate 100. At this time, in order to prevent damage to the stacked body 102 of the substrate 100, in other words, the pattern, it is desirable for pressure of the noble metal-containing member 10 exerted on the substrate 100 to be as small as possible.

Next, the liquid chemical supply nozzle 20 ejects the liquid chemical 200 toward the contact portion between the noble metal film 11 and the metal film 101 of the substrate 100. At this time, as shown in FIG. 3A, the noble metal film 11 is provided on the concave-convex surface of the noble metal-containing member 10. Therefore, the convex portions of the noble metal film 11 are in contact with respective portions of the metal film 101 which are provided on the convex portions of the pattern. The liquid chemical 200 comes into gaps between recess parts of the noble metal film 11 and the metal film 101, and is supplied onto the metal film 101 provided on the convex portions of the pattern. Thereby, galvanic corrosion takes place to promote etching of the metal film 101.

After that, after the noble metal-containing member 10 is elevated using the retention member 30, the substrate 100 is rotated using the retention member 31. After that, the noble metal-containing member 10 is moved down again to supply the liquid chemical 200 from the liquid chemical supply nozzle 20. Thereby, the metal film 101 formed at a different position from the previous one is etched. As above, all the unnecessary metal film 101 is removed.

According to the present embodiment described above, etching is performed with the alkaline liquid chemical 200 in the state where the convex portions of the noble metal film 11 are in partial contact with the metal film 101 of the substrate 100. Hence, while the metal film 101 in contact with the noble metal film 11 is removed through galvanic corrosion at a high etching rate, the insulator films 102a and the conductor films 102b not in contact with the noble metal film 11 are not removed. Therefore, the etching rate of the metal film 101 can be enhanced without damaging the pattern of the substrate 100. In particular, in the present embodiment, even if the metal film 101 to be etched and the conductor films 102b to be protected include the same metal (tungsten in the present embodiment), only the metal film 101 can be selectively etched, and the semiconductor device having a desired pattern can be manufactured.

Moreover, in the present embodiment, since the porous member is used for the noble metal-containing member 10, the liquid chemical 200 can also be impregnated in this porous member. For example, when the liquid chemical 200 is directly supplied onto this porous member from the liquid chemical supply nozzle 20, the liquid chemical 200 can be impregnated therein. In this case, since a new (unreacted) liquid chemical 200 is always supplied onto the contact portion between the noble metal film 11 and the metal film 101, the metal film 101 can be more surely removed. Notably, in the case where the liquid chemical 200 is directly supplied to the noble metal-containing member 10, in order not to prevent the liquid chemical 200 from permeating from the concave-convex surface of the noble metal-containing member 10, the noble metal film 11 is preferably formed partially on the concave-convex surface, not on the entire concave-convex surface. It should be noted that when the noble metal film 11 itself is a porous member, the liquid chemical 200 can permeate the noble metal film 11 even when the concave-convex surface is not formed on the noble metal-containing member 10.

Notably, in the present embodiment, in order that the liquid chemical can be easily supplied onto the surface of the metal film 101, the recesses of the noble metal-containing member 10 having the concave-convex surface are not in contact with the metal film, but a space is provided between the metal film 101 and the surface of the noble metal-containing member TO. Nevertheless, the surface of the noble metal-containing member 10 is not necessarily rough. As long as the liquid chemical 200 can be supplied onto the metal film 101, even when the noble metal-containing member 10 having a flat surface of noble metal is in contact with the metal film 101, a sufficient etching effect can be expected. For example, using the substrate treatment apparatus 1 in FIG. 1, the metal film 101 may be in contact with the surface of the noble metal film 11 of the noble metal-containing member 10 while directly supplying the liquid chemical 200 between the patterns of the metal film 101 of the substrate 100 to rotate the substrate. Thereby, the metal film 101 can be removed with etching.

Moreover, while in the present embodiment, the noble metal-containing member 10 is in contact with the pattern of the metal film 101 on the substrate 100, it may be contact with another metal surface, for example, a metal film provided in a bevel part of the wafer-like substrate 100. In this case, the metal film provided in the bevel part of the substrate 100 can be peeled off.

Second Embodiment

Figure 4:
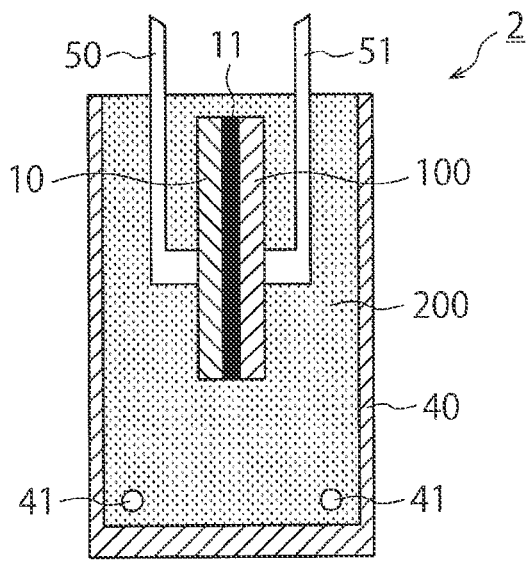
FIG. 4 is a schematic diagram showing a schematic configuration of a substrate treatment apparatus according to a second embodiment.

FIG. 4 is a schematic diagram showing a schematic configuration of a substrate treatment apparatus according to a second embodiment. A substrate treatment apparatus 2 shown in FIG. 4 includes the noble metal-containing member 10, a tank 40 (liquid chemical supply member), a retention member 50 (first retention member) and a retention member 51 (second retention member). Notably, the structures of the noble metal-containing member 10 and the substrate 100 are similar to those in the first embodiment, and their detailed description is omitted.

At the bottom part of the tank 40, supply ports 41 are provided. The tank 40 stores the alkaline liquid chemical 200 supplied from the supply ports 41. The noble metal-containing member 10 and the substrate 100 are immersed in this liquid chemical 200.

The retention member 50 retains the noble metal-containing member 10 conveyably to the tank 40. The retention member 50 is joined, for example, to a conveyance mechanism for the noble metal-containing member 10 or constituted as a part of the conveyance mechanism.

The retention member 51 retains the substrate 100 conveyably to the tank 40. The retention member 51 is joined, for example, to a conveyance mechanism for the substrate 100 or constituted as a part of the conveyance mechanism.

Figure 5:
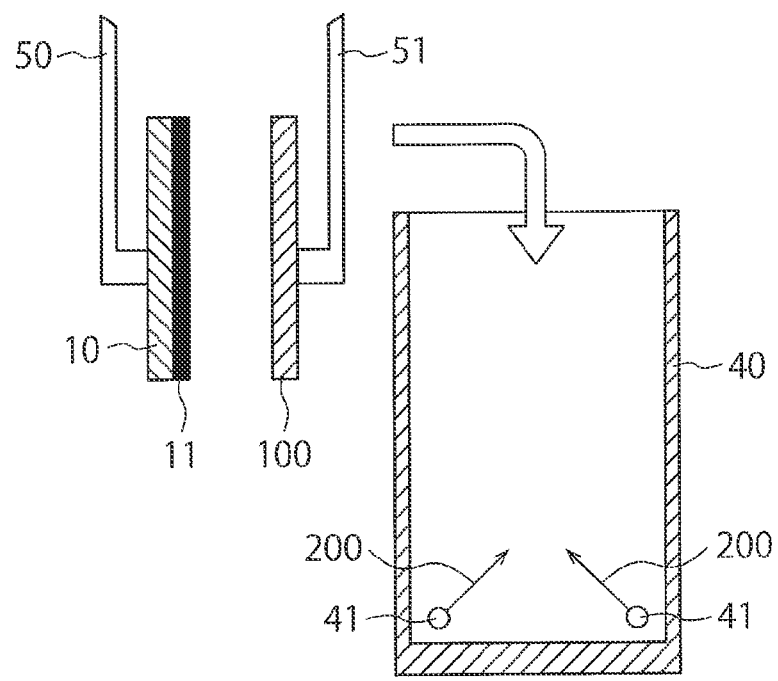
FIG. 5 is a schematic diagram for explaining an etching step of a substrate according to the second embodiment.

Hereafter, a substrate treatment method using the substrate treatment apparatus 2 according to the present embodiment is described using FIG. 5, Also similarly to the first embodiment, an etching step of the substrate 100 is herein described. FIG. 5 is a schematic diagram for explaining an etching step of the substrate 100 according to the second embodiment.

First, the noble metal-containing member 10 is conveyed into the tank 40 using the retention member 50, and the substrate 100 is conveyed into the tank 40 using the retention member 51. In the tank 40, the noble metal-containing member 10 and the substrate 100 are in contact with each other. Specifically, the noble metal film 11 of the noble metal-containing member 10 is in partial contact with the metal film 101 of the substrate 100. At this time, in order to prevent damage to the stacked body 102 of the substrate 100, it is desirable for pressure at the contact portion between the metal film 101 and the noble metal film 11 to be as small as possible.

Next, the alkaline liquid chemical 200 is supplied into the tank 40 from the supply ports 41. Upon the liquid chemical 200 being stored in the tank 40, as shown in FIG. 4, the noble metal-containing member 10 and the substrate 100 are immersed in the liquid chemical 200. This liquid chemical 200 comes into the gaps between the noble metal film 11 and the metal film 101. Therefore, similarly to the first embodiment, galvanic corrosion takes place to promote etching of the metal film 101. After that, the noble metal-containing member 10 and the substrate 100 are taken out of the tank 40, and the noble metal-containing member 10 and another substrate 100 are conveyed into the tank 40.

According to the present embodiment described above, similarly to the first embodiment, by etching the metal film 101 through galvanic corrosion, the metal film 101 can be removed at a high etching rate while preventing damage to the pattern of the substrate 100.

Moreover, in the present embodiment, the metal film 101 is removed by batch in the tank 40. Accordingly, an etching time can be shortened as compared with the first embodiment.

Third Embodiment

Figure 6:
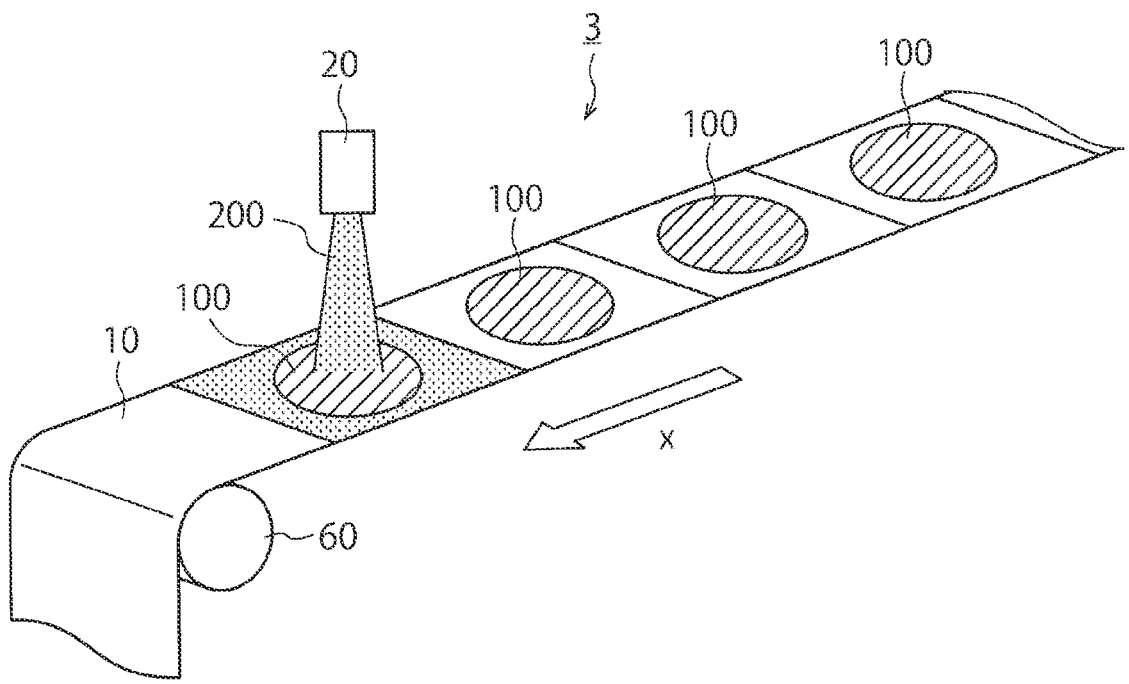
FIG. 6 is a schematic diagram showing a schematic configuration of a substrate treatment apparatus according to a third embodiment.

FIG. 6 is a schematic diagram showing a schematic configuration of a substrate treatment apparatus according to a third embodiment. A substrate treatment apparatus 3 shown in FIG. 6 includes the noble metal-containing member 10, the liquid chemical supply nozzle 20 and a drive mechanism 60. Notably, the structures of the liquid chemical supply nozzle 20 and the substrate 100 are similar to those in the first embodiment, and their detailed description is omitted.

The shape of the noble metal-containing member 10 is the shape of a belt that retains a plurality of substrates 100. On the surface of the belt, the noble metal film 11 (not shown in FIG. 6) is formed. The noble metal film 11 may be deposited on a soft member, for example, of silicone rubber or the like. Otherwise, the noble metal-containing member 10 itself may be formed as a thin belt of the noble metal film 11.

The drive mechanism 60 is attached to the noble metal-containing member 10. With the drive mechanism 60 rotating, the noble metal-containing member 10 moves in one direction X below the liquid chemical supply nozzle 20. In other words, the drive mechanism 60 conveys the plurality of substrates 100 in a belt conveyer manner.

Hereafter, a substrate treatment method using the substrate treatment apparatus 3 according to the present embodiment is described. Also similarly to the first embodiment, an etching step of the substrate 100 is herein described.

Figure 7:
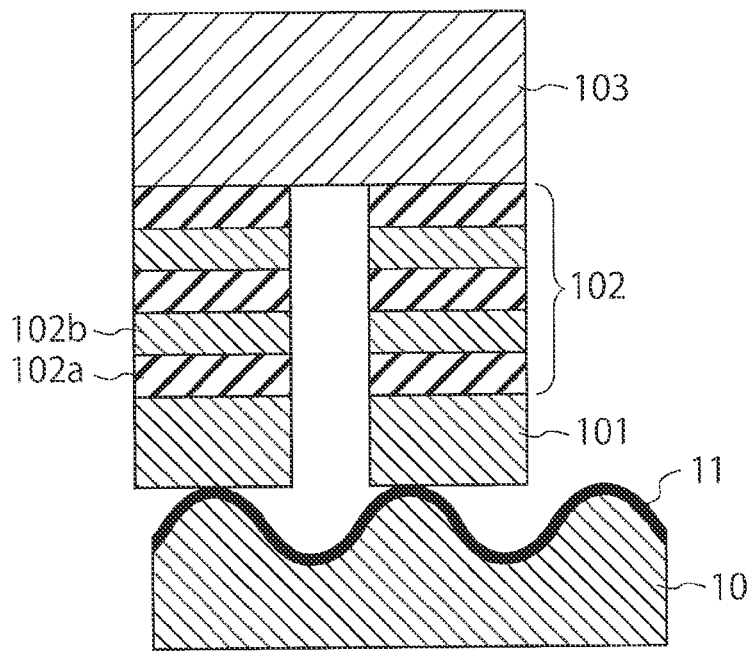
FIG. 7 is an expanded view having a contact portion between a substrate and the noble metal-containing member expanded.

First, the substrates 100 are reversed and placed on the noble metal-containing member 10. Hence, as shown in FIG. 7, the metal film 101 of the substrate 100 comes into contact with the noble metal film 11 of the noble metal-containing member 10, Subsequently, the drive mechanism 60 drives the noble metal-containing member 10 to convey the substrates 100. When the substrate 100 comes right below the liquid chemical supply nozzle 20, the liquid chemical supply nozzle 20 ejects the liquid chemical 200.

The ejected liquid chemical 200 spreads from the substrate 100 to the noble metal film 11. At this time, the liquid chemical 200 also comes into the gaps between the metal film 101 and the noble metal film 11, Hence, similarly to the aforementioned other embodiments, galvanic corrosion takes place to promote etching of the metal film 101.

After that, upon the drive mechanism 60 driving the noble metal-containing member 10, the next substrate 100 comes right below the liquid chemical supply nozzle 20, and the metal film 101 provided on the substrate 100 is similarly removed. As above, the metal films 101 respectively provided on the plurality of substrates 100 placed on the noble metal-containing member 10 are continuously removed.

Also in the present embodiment described above, by etching the metal film 101 through galvanic corrosion, the metal film 101 can be removed at a high etching rate while preventing damage to the pattern of the substrate 100.

Moreover, in the present embodiment, continuous etching of the plurality of substrates 100 is possible. Accordingly, an operation rate of the device can be improved.

Fourth Embodiment

Figure 8:
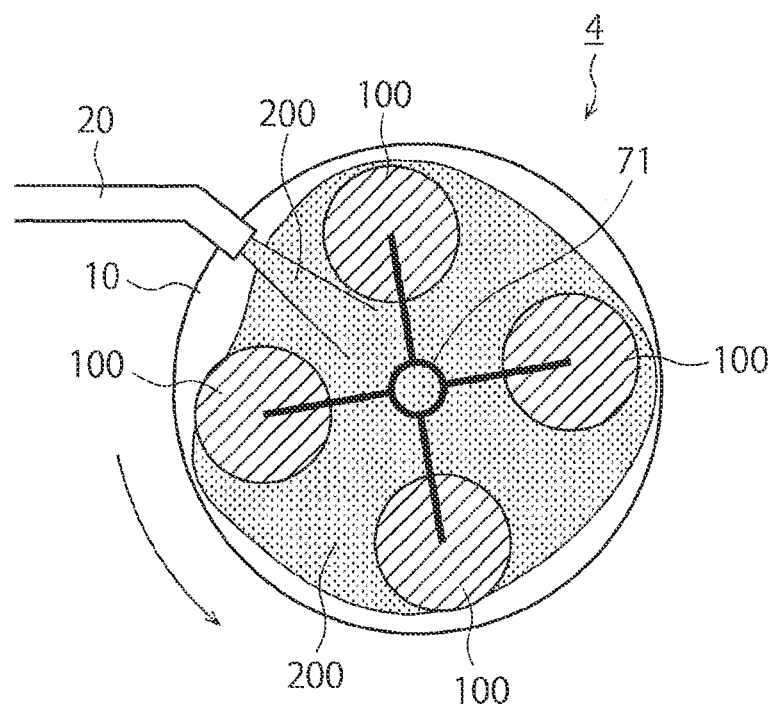
FIG. 8 is a schematic diagram showing a schematic configuration of a substrate treatment apparatus according to a fourth embodiment.
Figure 9:
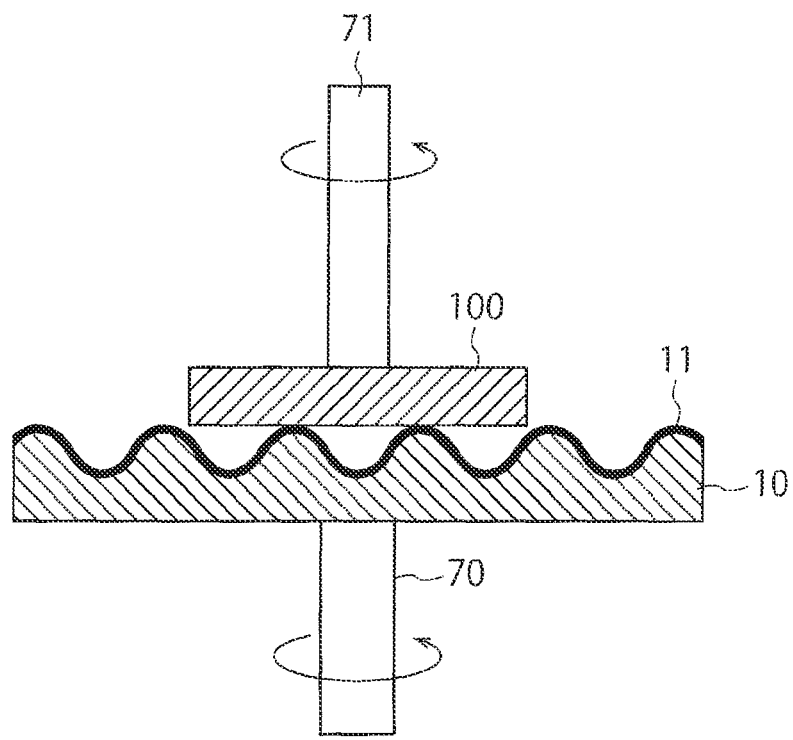
FIG. 9 is an expanded view having the essential part of the substrate treatment apparatus shown in FIG. 8 expanded.

FIG. 8 is a schematic diagram showing a schematic configuration of a substrate treatment apparatus according to a fourth embodiment. FIG. 9 is an expanded view having the essential part of a substrate treatment apparatus 4 shown in FIG. 8 expanded.

As shown in FIG. 8 and FIG. 9, the substrate treatment apparatus 4 according to the present embodiment includes the noble metal-containing member 10, the liquid chemical supply nozzle 20, a retention member 70 (first retention member) and a retention member 71 (second retention member). Notably, the structures of the liquid chemical supply nozzle 20 and the substrate 100 are similar to those in the first embodiment, and their detailed description is omitted.

The noble metal-containing member 10 is formed into a disc shape on which a plurality of substrates 100 are retained. The upper face of the noble metal-containing member 10 is a concave-convex surface. As shown in FIG. 9, the noble metal film 11 is provided on this concave-convex surface. Notably, similarly to the third embodiment, the noble metal-containing member 10 may be deposited on a soft member of silicone rubber or the like. Otherwise, the noble metal-containing member 10 itself may be formed as a thin disc.

The retention member 70 rotably retains the noble metal-containing member 10. The retention member 70 is joined, for example, to a rotation mechanism or constituted as a part of the rotation mechanism.

The retention member 71 retains a plurality of substrates 100 rotatably in the same direction and synchronously to the noble metal-containing member 10. The retention member 71 is joined, for example, to the same rotation mechanism as that for the retention member 70 or constituted as a part of the rotation mechanism.

Hereafter, a substrate treatment method using the substrate treatment apparatus 4 according to the present embodiment is described. Also similarly to the first embodiment, an etching step of the substrate 100 is herein described.

First, the plurality of substrates 100 retained on the retention member 71 are placed on the noble metal-containing member 10. At this time, the substrates 100 are reversed and retained on the retention member 71 such that the metal films 101 are in contact with the noble metal film 11.

Subsequently, the noble metal-containing member 10 is rotated using the retention member 70. Synchronously to the rotation of the noble metal-containing member 10, the substrates 100 are also rotated in the same direction. Therefore, almost no shearing stress is exerted between the noble metal-containing member 10 and the substrates 100.

Next, the liquid chemical supply nozzle 20 ejects the alkaline liquid chemical 200 toward the center of the noble metal-containing member 10. The ejected liquid chemical 200 spreads toward the circumference of the noble metal-containing member 10 due to centrifugal force originated from the rotation of the noble metal-containing member 10. At this time, the liquid chemical 200 also comes into the gaps between the metal films 101 and the noble metal film 11. Therefore, similarly to the aforementioned other embodiments, galvanic corrosion takes place to promote etching of the metal film 101.

Also in the present embodiment described above, the etching rate is enhanced by bringing the metal films 101 into contact with the noble metal film 11. Moreover, in the present embodiment, since the substrates 100 rotate in the same direction and synchronously to the noble metal-containing member 10, almost no shearing stress is exerted between these. Therefore, damage to the pattern of the substrate 100 can be prevented.

Fifth Embodiment

Figure 10A:
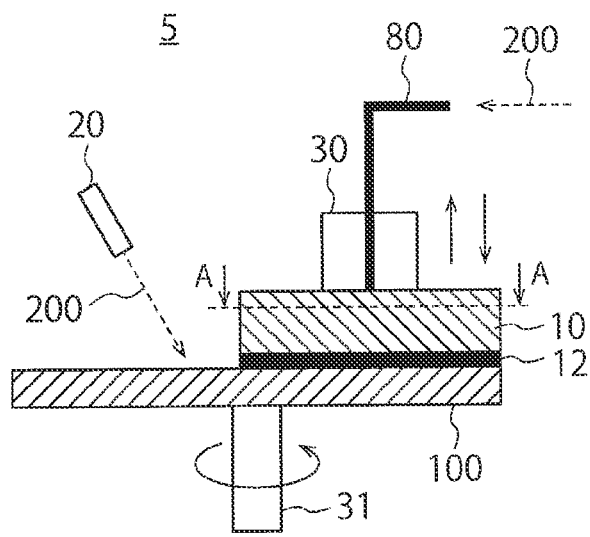
FIG. 10A is a schematic diagram showing a schematic configuration of a substrate treatment apparatus according to a fifth embodiment.

FIG. 10A is a schematic diagram showing a schematic configuration of a substrate treatment apparatus according to a fifth embodiment. As shown in FIG. 10A, a substrate treatment apparatus 5 of the present embodiment includes a liquid passing nozzle 80 (liquid chemical supply member) that directly supplies the liquid chemical 200 to the noble metal-containing member 10.

Figure 10B:
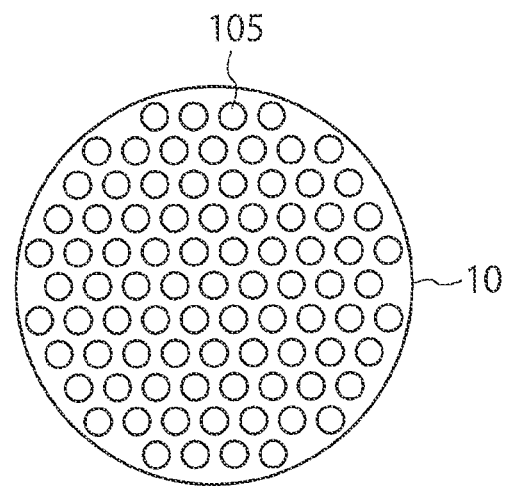
FIG. 10B is a cross-sectional view taken along the sectional line A-A shown in FIG. 10A.

FIG. 10B is a cross-sectional view taken along the sectional line A-A shown in FIG. 10A, As shown in FIG. 10B, the noble metal-containing member 10 of the present embodiment has a plurality of liquid passing holes 105. The liquid passing holes 105 communicate with the liquid passing nozzle 80.

Figure 11A:
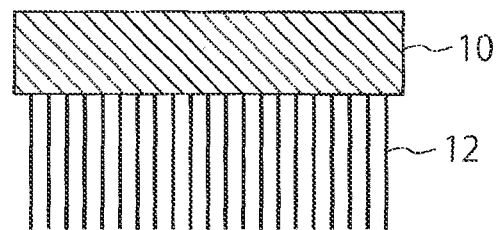
FIG. 11A is an expanded view of the noble metal-containing member 10 of the fifth embodiment.

FIG. 11A is an expanded view of the noble metal-containing member 10. As shown in FIG. 11A, a plurality of flexible hair members 12 that are bundled into a brush are provided on the bottom face of the noble metal-containing member 10 of the present embodiment. These hair members 12 constitute a concave-convex shape part of the noble metal-containing member 10.

Figure 11B:
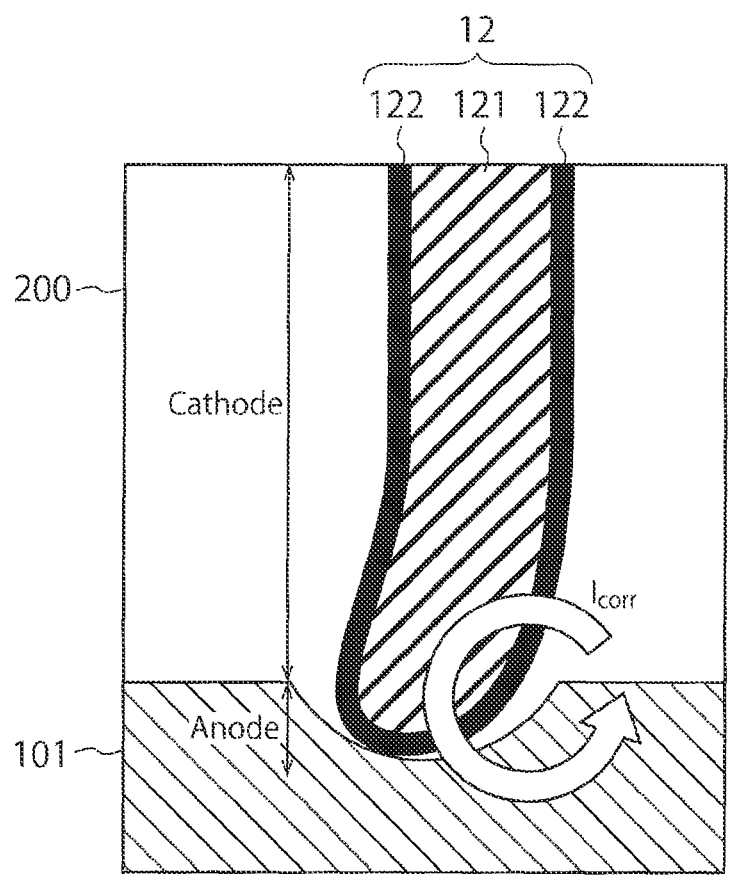
FIG. 11B is an expanded view of a hair member shown in FIG. 11A.

FIG. 11B is an expanded view of the hair member 12. As shown in FIG. 11B, in the hair member 12, an insulator 121 constitutes a core part. The insulator 121 is covered with a noble metal film 122. The insulator 121 includes polypropylene, for example. The noble metal film 122 includes platinum, for example. The noble metal film 122 may partially cover the insulator 121 or may cover the whole insulator 121. Moreover, the insulator 121 may be covered with noble metal nanoparticles.

With the substrate treatment apparatus 5, when the liquid passing nozzle 80 supplies the liquid chemical 200 to the noble metal-containing member 10, the liquid chemical 200 passes through the liquid passing holes 105 and flows along the lateral faces of the hair members 12. Thereby, when an article to be processed such, for example, as the metal film 101 (see FIG. 3) is etched, a contact portion (etching portion) between the hair member 12 and the metal film 101 is filled with the liquid chemical 200 as shown in FIG. 11B.

When the metal film 101 and the tip part of the hair member 12 are in contact with each other, the metal film 101 becomes a high potential anode region, and the hair member 12 becomes a low potential cathode region. A potential difference between these causes galvanic corrosion to take place. At this time, a corrosion current "$I_{corr}$" can be calculated based on expression (1) below.

$$I_{corr}=(E_{cathode}-E_{anode})/(R_{electrolyte}+R_{anode}+R_{cathode}+R_{a/e}+R_{c/e}) \quad (1)$$

In expression (1), the electromotive force "$E_{anode}$" and the resistance "$R_{anode}$" denote the electromotive force and the resistance of the anode region, respectively. The electromotive force "$E_{cathode}$" and the resistance "$R_{cathode}$" denote the electromotive force and the resistance of the cathode region, respectively. The resistance "$R_{electrolyte}$" denotes the resistance of the liquid chemical 200. The contact resistance "$R_{a/e}$" denotes the contact resistance between the anode region and the liquid chemical 200, that is, the contact resistance between the metal film 101 and the liquid chemical 200. The contact resistance "$R_{c/e}$" denotes the contact resistance between the cathode region and the liquid chemical 200, that is, the contact resistance between the hair member 12 and the liquid chemical 200.

In the present embodiment, since the tip part of the hair member 12 flexibly bends in etching, the contact area between the metal film 101 and the noble metal film 122 becomes large. Hence, the contact resistance "$R_{a/c}$" between the anode region and the cathode region becomes small. Thereby, the etching rate can be efficiently enhanced.

Notably, in the present embodiment, the liquid chemical 200 may be, for example, a strongly alkaline solution having high conductivity. In this case, the resistance "$R_{electrolyte}$",  the contact resistance "$R_{a/e}$" and the contact resistance "$R_{c/e}$" are small. Therefore, the corrosion current "$I_{corr}$" increases based on expression (1) above, and the etching rate can be enhanced.

Sixth Embodiment

Figure 12A:
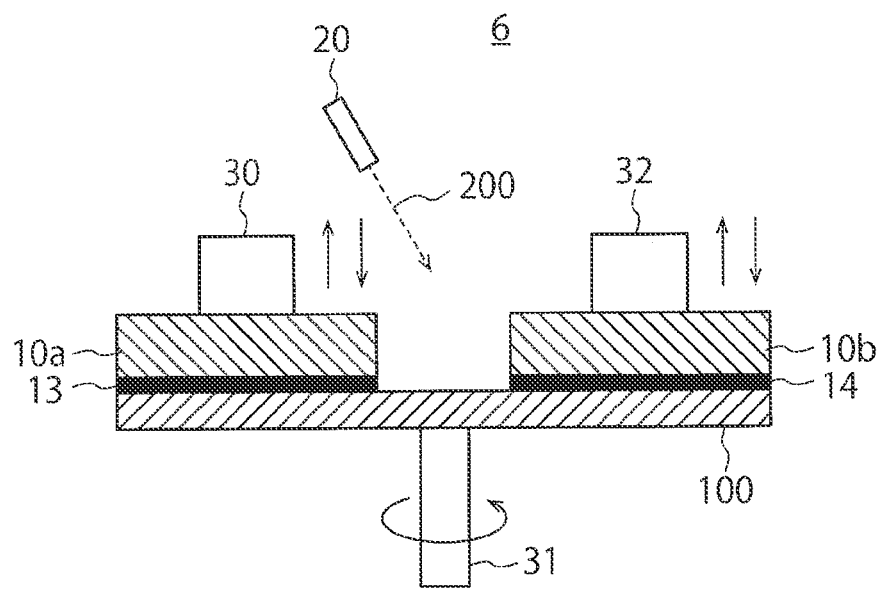
FIG. 12A is a schematic diagram showing a schematic configuration of a substrate treatment apparatus according to a sixth embodiment.

FIG. 12A is a schematic diagram showing a schematic configuration of a substrate treatment apparatus 6 according to a sixth embodiment. As shown in FIG. 12A, the substrate treatment apparatus 6 of the present embodiment is different from the substrate treatment apparatus 1 of the first embodiment in including a first noble metal-containing member 10a and a second noble metal-containing member 10b in place of the noble metal-containing member 10.

Figure 12B:
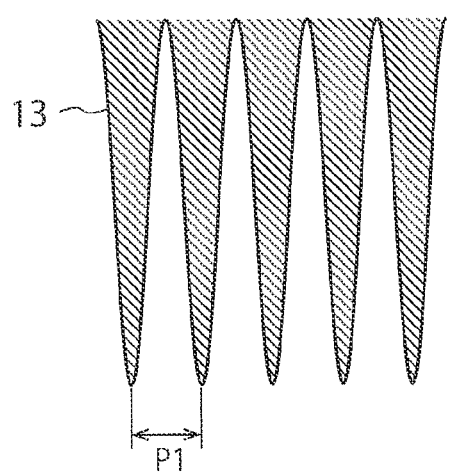
FIG. 12B is an expanded view of a first noble metal-containing member.

FIG. 12B is an expanded view of the first noble metal-containing member 10a. As shown in FIG. 12B, a plurality of flexible hair members 13 that are bundled into a brush are provided on the bottom face of the first noble metal-containing member 10a. These hair members 13 constitute a concave-convex shape part of the first noble metal-containing member 10a. Noble metal films are formed on the surfaces of the hair members 13 similarly to the hair members 12 described for the fifth embodiment.

Figure 12C:
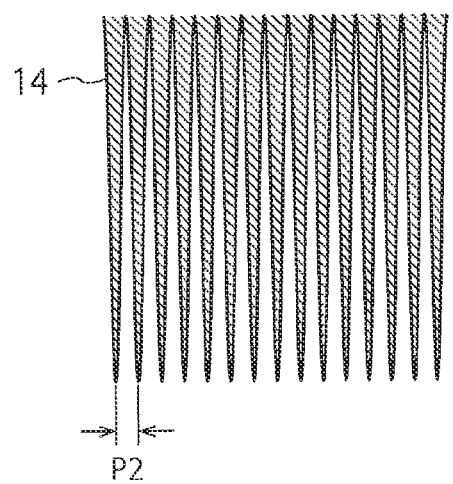
FIG. 12C is an expanded view of a second noble metal-containing member.

FIG. 12C is an expanded view of the second noble metal-containing member 10b. As shown in FIG. 12C, a sponge 14 having a concave-convex shape is provided on the bottom face of the second noble metal-containing member 10b. A noble metal film is formed also on the surface of the sponge 14. The pitch p2 (second pitch) between convex portions of the sponge 14 is smaller than the pitch p1 (first pitch) between tip parts of the hair members 13. Notably, structures of the first noble metal-containing member 10a and the second noble metal-containing member 10b are not limited to the aforementioned structures.

Figure 13A:
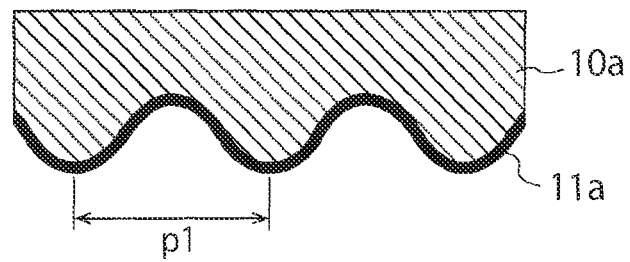
FIG. 13A is an expanded view showing a modification of the first noble metal-containing member.

FIG. 13A is an expanded view showing a modification of the first noble metal-containing member 10a. As shown in FIG. 13A, the first noble metal-containing member 10a may have a concave-convex shape covered by a first noble metal film 11a, for example, similarly to the noble metal-containing member 10 of the first embodiment.

Figure 13B:
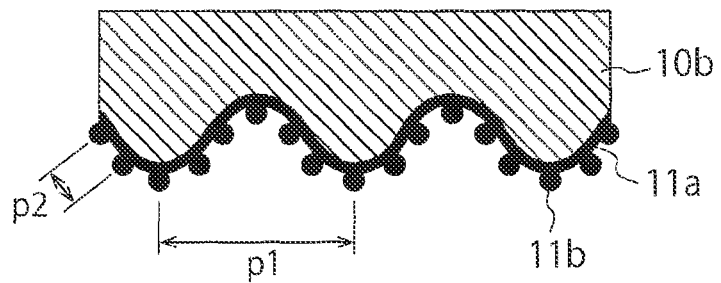
FIG. 13B is an expanded view showing a modification of the second noble metal-containing member.

FIG. 13B is an expanded view showing a modification of the second noble metal-containing member 10b. As shown in FIG. 13B, in the second noble metal-containing member 10b, second noble metal films 11b may be formed on the surface of the first noble metal film 11a. The pitch p2 (second pitch) of the second noble metal films 11b is smaller than the pitch p1 (first pitch) of the first noble metal film 11a.

Hereafter, a production method of a semiconductor device using the substrate treatment apparatus 6 according to the present embodiment is described. The substrate treatment apparatus 6 is used, for example, for removing the metal film 101 formed on the stacked body 102 shown in FIG. 3.

First, by moving down the first noble metal-containing member 10a with the retention member 30, the hair members 13 or the first noble metal film 11a is brought into contact with the metal film 101 of the substrate 100.

Next, the liquid chemical supply nozzle 20 ejects the liquid chemical 200. As a result, the liquid chemical 200 comes into gaps between the hair members 13 or recess portions of the noble metal film 11a, and is supplied onto the metal film 101, thereby, galvanic corrosion takes place to promote etching of the metal film 101.

Subsequently, the first noble metal-containing member 10a is elevated using the retention member 30, and the second noble metal-containing member 10b is moved down using a retention member 32 (third retention member). After that, by the liquid chemical 200 supplied again from the liquid chemical supply nozzle 20, the metal film 101 is etched. At this time, since the pitch p2 of the second noble metal-containing member 10b is smaller than the pitch p1 of the first noble metal-containing member 10a, its surface area is large. Therefore, the contact area with the metal film 101 is large. Thereby, the metal film 101 that has remained in etching with the first noble metal-containing member 10a can be removed.

Notably, combining the first noble metal-containing member 10a and the second noble metal-containing member 10b can also be applied for purposes other than removing the residue of an article to be processed. Moreover, etching may be performed alternately with the first noble metal-containing member 10a and the second noble metal-containing member 10b, other than using the aforementioned method.

According to the substrate treatment apparatus 6 according to the present embodiment, noble metal-containing members different in pitch are included, and thereby, a metal film can be more securely etched.

Seventh Embodiment

Figure 14:
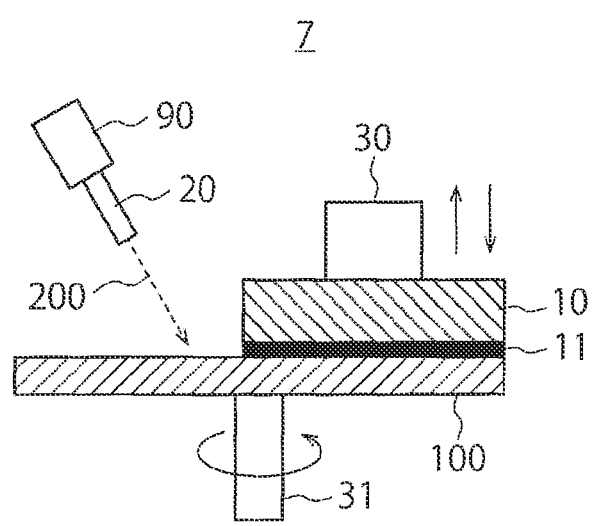
FIG. 14 is a schematic diagram showing a schematic configuration of a substrate treatment apparatus according to a seventh embodiment.

FIG. 14 is a schematic diagram showing a schematic configuration of a substrate treatment apparatus according to a seventh embodiment. As shown in FIG. 14, a substrate treatment apparatus 7 according to the present embodiment includes a cooling mechanism 90 in addition to the constituents of the substrate treatment apparatus 1 of the first embodiment. The cooling mechanism 90 is installed, for example, in an end part of the liquid chemical supply nozzle 20, and cools the liquid chemical 200. The cooling mechanism 90 cools the liquid chemical 200, for example, using coolant gas.

Figure 15A:
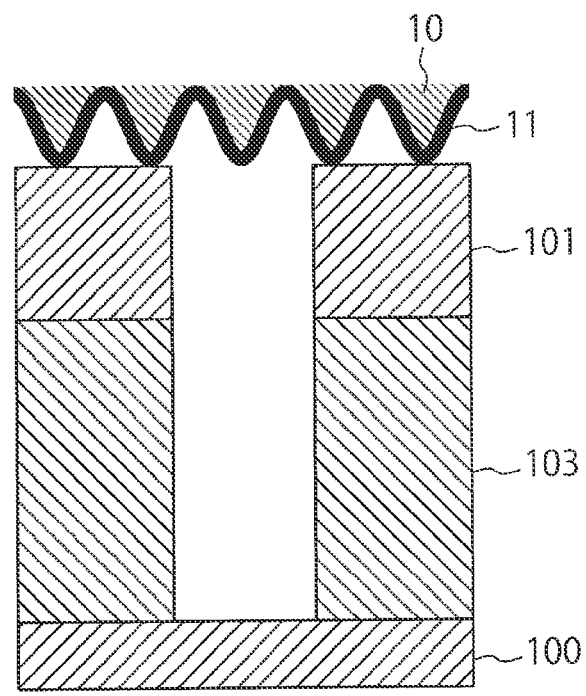
FIG. 15A shows a state before an etching treatment of a substrate in the seventh embodiment.
Figure 15B:
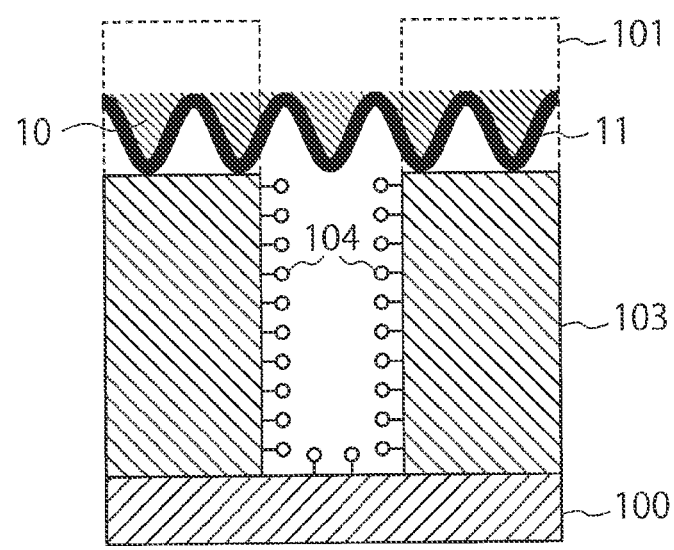
FIG. 15B shows a state after the etching treatment of the substrate.

FIG. 15A shows a state of the substrate 100 before an etching treatment thereof in the present embodiment. FIG. 15b shows a state of the substrate 100 after the etching treatment thereof in the present embodiment. In the present embodiment, a film 103 is on the substrate 100, and the metal film 101 is on the film 103. The film 103 may be a metal film or may be an insulative film.

In the case where the metal film 101 is etched using the noble metal-containing member 10, when the liquid chemical 200 at a high temperature and a high concentration is used, the etching rate is high. When the etching rate is unnecessarily high, it is concerned that a part of the film 103 is also etched as well as the metal film 101.

Therefore, in the present embodiment, the liquid chemical 200 is cooled by the cooling mechanism 90, and thereby, excess etching can be prevented. Accordingly, etching accuracy of the metal film 101 can be improved.

Notably, in order to prevent excess etching as above, the liquid chemical 200 may be diluted. In this case, since the concentration of the liquid chemical 200 is reduced, etching of the film 103 can be prevented. Accordingly, etching accuracy of the metal film 101 can be improved.

Moreover, the cooling mechanism 90 may be installed in a lower part of the substrate 100. In this case, since the substrate 100 is brought to a low temperature state, the liquid chemical 200 can be cooled via the substrate 100 in etching the metal film 101.

Furthermore, in the present embodiment, a surface protecting agent 104 may be added onto the surface of the film 103. As the surface protecting agent 104, an anti-corrosion agent or a coating formation agent by way of example can be used. When the surface protecting agent 104 is the anti-corrosion agent and the film 103 is a metal film, corrosion of the film 103 can be suppressed. Meanwhile, when the surface protecting agent 104 is the coating formation agent and the film 103 is an insulative film, dissolution of the film 103 can be suppressed.

Eighth Embodiment

Figure 16:
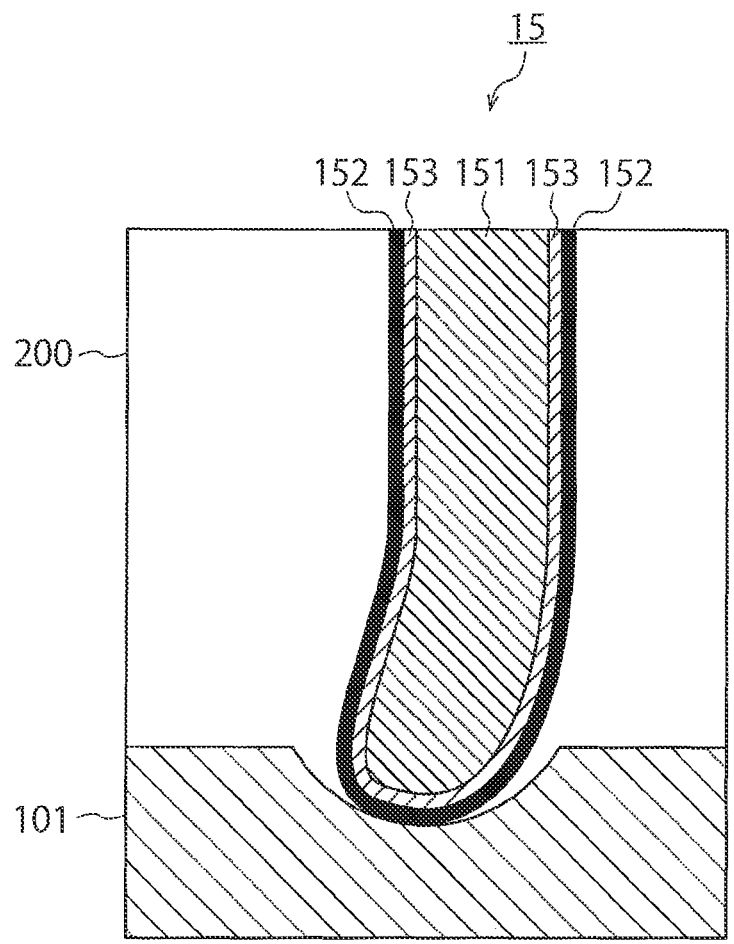
FIG. 16 is an expanded view of a hair member provided in a noble metal-containing member of an eighth embodiment.

FIG. 16 is an expanded view of a hair member 15 provided in the noble metal-containing member 10 according to an eighth embodiment. In the present embodiment, hair members 15 are provided in place of the hair members 12 of the noble metal-containing member 10 according to the fifth embodiment shown in FIG. 11A.

In the hair member 15, a conductor 151 is covered by a metal film 153, and the metal film 153 is covered by a noble metal film 152. The conductor 151 includes conductive carbon, for example. The noble metal film 152 includes platinum, for example. The metal film 153 includes metal which is smaller in specific resistance than noble metal and which is, for example, copper.

According to the present embodiment mentioned above, the core part of the hair member 15 is constituted of the conductor 151, Therefore, the resistance of the cathode region "$R_{cathode}$" is smaller than that for the hair member 12 of the fifth embodiment. Thereby, the corrosion current "$I_{corr}$" increases, and the etching rate can be enhanced.

Furthermore, in the present embodiment, the metal film 153 smaller in specific resistance than the noble metal film 152 is formed between the conductor 151 and the noble metal film 152, Therefore, the aforementioned resistance "$R_{cathode}$" can be further reduced, and as a result, the etching rate can be further enhanced.

Ninth Embodiment

Figure 17A:
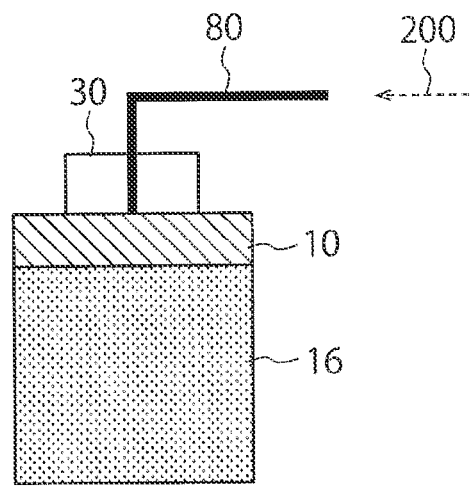
FIG. 17A is a diagram showing a schematic configuration of a noble metal-containing member according to a ninth embodiment.

FIG. 17A is a diagram showing a schematic configuration of the noble metal-containing member 10 according to a ninth embodiment. In the present embodiment, a conductive support 16 including noble metal is provided on the bottom face of the noble metal-containing member 10 in place of the hair members 15 according to the fifth embodiment shown in FIG. 11A. The support 16 is constituted of a porous material such as an ion exchange resin. The inside of the support 16 includes nanoparticles, for example, of platinum or the like.

In the present embodiment, when the liquid passing nozzle 80 supplies the liquid chemical 200 to the noble metal-containing member 10, the liquid chemical 200 passes through the liquid passing holes 105 formed in the noble metal-containing member 10. After that, the liquid chemical 200 passes through the inside of the support 16 and flows out to the contact portion between the support 16 and an article to be processed, After that, the article to be processed is etched with the noble metal included in the support 16 and the liquid chemical 200.

According to the present embodiment described above, etching can be promoted with the noble metal included in the support 16 while securing liquid permeability for the liquid chemical 200 by the support 16.

Figure 17B:
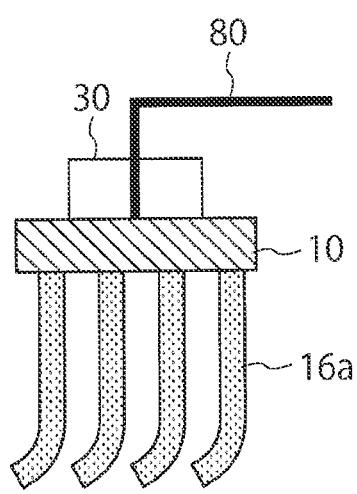
FIG. 17B shows a modification of a support.
Figure 17C:
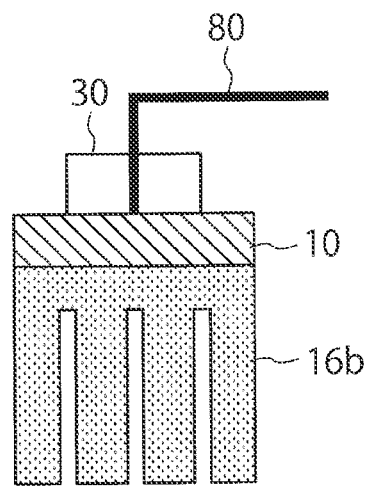
FIG. 17C shows another modification of the support.

Notably, in the present embodiment, the support 16 may be processed, for example, into a hair-like shape like a support 16a shown in FIG. 17b. Otherwise, the support 16 may be processed, for example, into a comb-like shape like a support 16b shown in FIG. 17B. In these cases, since the flow channels for the liquid chemical 200 are expanded, liquid permeability for the liquid chemical 200 toward the etching portion can be improved.

Tenth Embodiment

Figure 18A:
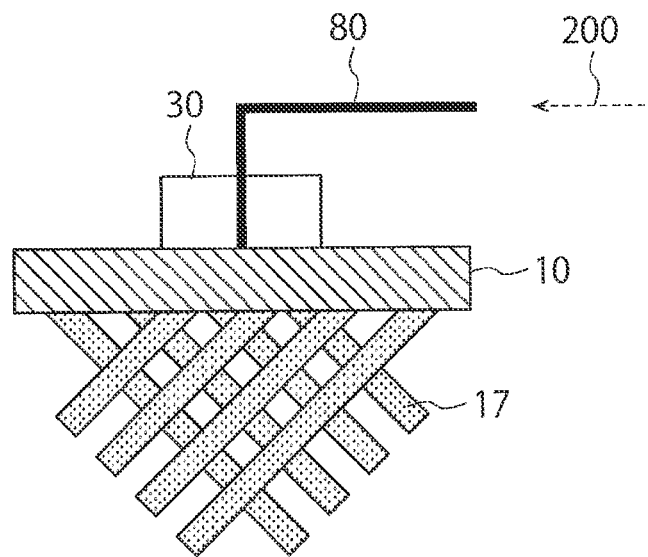
FIG. 18A is a diagram showing a schematic configuration of a noble metal-containing member according to a tenth embodiment.

FIG. 18A is a diagram showing a schematic configuration of the noble metal-containing member 10 according to a tenth embodiment. In the present embodiment, a net-like body 17 including noble metal is provided on the bottom face of the noble metal-containing member 10 in place of the hair members 15 according to the fifth embodiment shown in FIG. 11A.

Figure 18B:
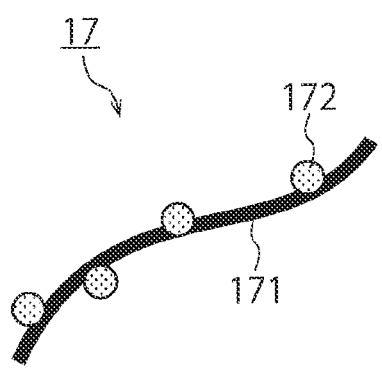
FIG. 18B is an expanded view of a net-like body.

FIG. 18B is an expanded view of the net-like body 17. In the net-like body 17, thread-like conductive carbon 171 is processed into a net shape. Noble metal nanoparticles 172 adhere onto the conductive carbon 171.

In the present embodiment, when the liquid passing nozzle 80 supplies the liquid chemical 200 to the noble metal-containing member 10, the liquid chemical 200 passes through the liquid passing holes 105 formed in the noble metal-containing member 10. After that, the liquid chemical 200 passes through gaps in the net-like body 17 and flows out to the contact portion between the net-like body 17 and an article to be processed. After that, the article to be processed is etched with the noble metal nanoparticles 172 included in the net-like body 17 and the liquid chemical 200.

According to the present embodiment described above, etching can be promoted with the nanoparticles 172 included in the net-like body 17 while securing liquid permeability for the liquid chemical 200 by the net-like body 17.

Eleventh Embodiment

Figure 19:
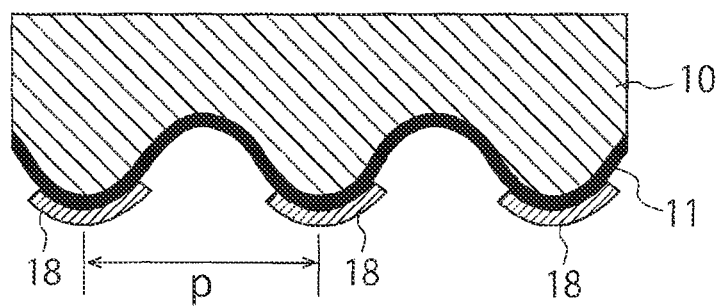
FIG. 19 is an expanded view having a part of the bottom face of a noble metal-containing member according to an eleventh embodiment expanded.

FIG. 19 is an expanded view having a part of the bottom face of a noble metal-containing member according to an eleventh embodiment expanded. As shown in FIG. 19, intermediate members 18 are formed on convex portions of the noble metal film 11. The intermediate member 18 can be considered to be, for example, a metal, a simple substance or a compound including carbon, a polymer, or the like having conductivity. Since the intermediate member 18 is a conductor, electric connection between the metal film 101 and the noble metal-containing member 10 is secured. Namely, a corrosion circuit for the metal film 101 is established. The intermediate member 18 is still preferably a simple substance or a compound including carbon, Including carbon enhances a reduction potential, and a corrosion rate, that is, etching rate can be improved.

Also in the present embodiment, the metal film 101 can be etched via the intermediate members 18 even when the noble metal film 11 is not directly in contact with the metal film 101 while supplying the liquid chemical 200.

Furthermore, in the present embodiment, since the noble metal film 11 is not directly in contact with the metal film 101 which is an article to be processed, noble metal constituting the noble metal film 11 can be prevented from being eliminated due to abrasion. Preventing elimination of noble metal can also prevent noble metal contamination of the article to be processed.

Notably, while in FIG. 19, the intermediate members 18 are shown to be provided on the convex portions of the noble metal-containing member 10 shown for the first embodiment, with no limitation to the first embodiment, they may be provided, for example, on the contact portions of the metal film 101 with the hair members 12, 15 shown for the fifth embodiment and the eighth embodiment. Moreover, with no limitation to the convex portions only, the intermediate members 18 may be formed in recess portions of the noble metal-containing member 10.

When the intermediate members 18 of the present embodiment are applied to the aforementioned hair members 12, 15, it can be considered to reduce the resistance of the liquid chemical 200 in order to more improve the corrosion rate. Otherwise, it can also be considered to reduce the resistance of the intermediate members 18.

In order to reduce the resistance of the liquid chemical 200, for example, a salt may be added to the liquid chemical 200, or the distance between the hair member 12, 15 which forms the cathode region and the metal film 101 which forms the anode region may be reduced. In order to reduce the resistance of the intermediate member 18, the volume of the intermediate member 18 may be increased. Notably, the intermediate member 18 may be film-like or may be in a mesh form in which fibrous materials are stacked.

Figure 20A:
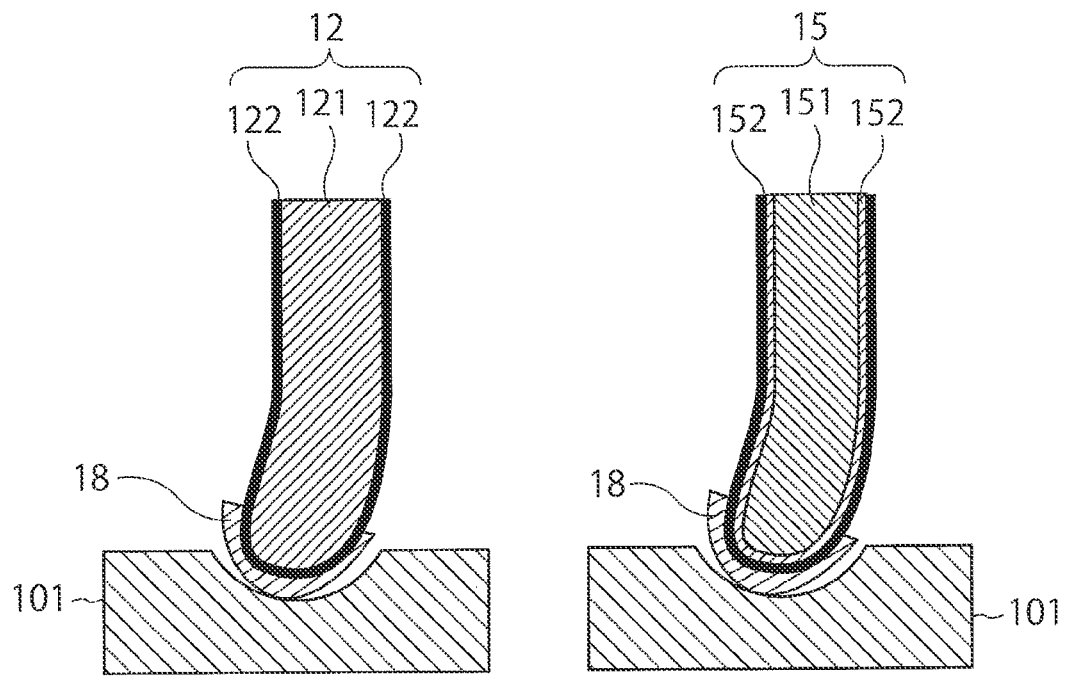
FIG. 20A shows a modification of the noble metal-containing member according to the eleventh embodiment.
Figure 20B:
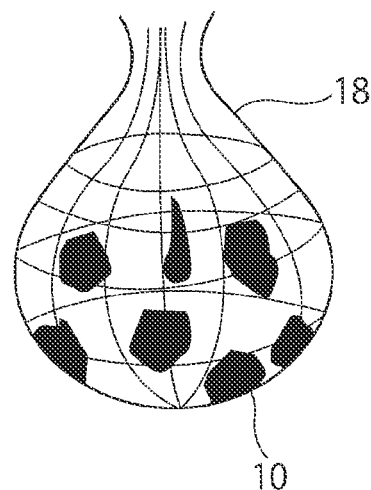
FIG. 20B shows another modification of the noble metal-containing member according to the eleventh embodiment.
Figure 20C:
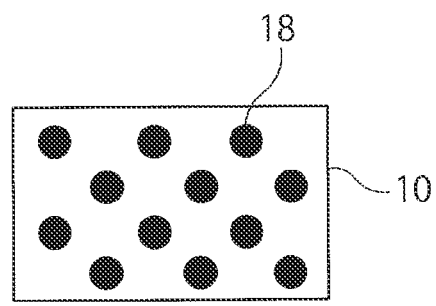
FIG. 20C shows still another modification of the noble metal-containing member according to the eleventh embodiment.

For example, as shown in FIG. 20A, it can be considered to provide the intermediate member 18 which is in a mesh form between the aforementioned hair member 12, 15 and the metal film 101 which is a film to be processed. Moreover, as another modification, as shown in FIG. 20B, the noble metal-containing member 10 may be configured as noble metal particles such as platinum particles, and the mesh-like intermediate member 18 may be provided so as to enclose the relevant noble metal particles. In this case, since the mesh-like intermediate member 18 has liquid permeability, the metal film 101 can be etched with the effects of the present embodiment attained. As shown in FIG. 20C, as still another modification, the intermediate members 18 may be partially provided on the bottom face (at the lower end) of the plate-shaped noble metal-containing member 10. Also in this case, the metal film 101 can be etched while the intermediate members 18 are in contact with the metal film 101.

Twelfth Embodiment

Figure 21:
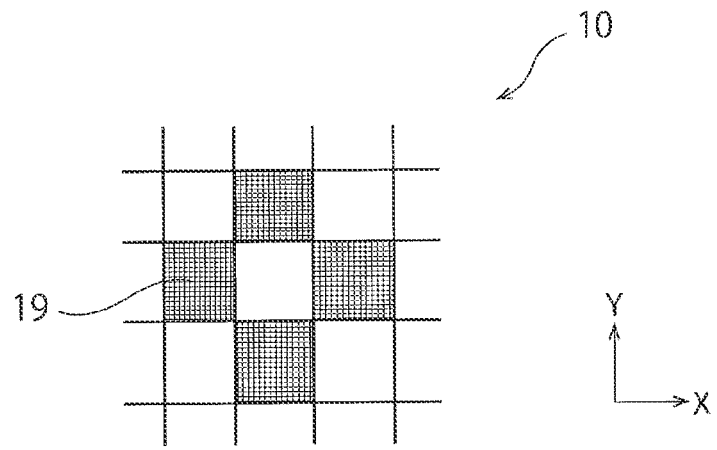
FIG. 21 is an expanded view having a part of the bottom face of a noble metal-containing member according to a twelfth embodiment expanded.

FIG. 21 is an expanded view having a part of the bottom face of a noble metal-containing member according to a twelfth embodiment expanded. As shown in FIG. 21, the noble metal-containing member 10 according to the present embodiment is constituted of a plurality of grid stacked bodies 19. The plurality of grid stacked bodies 19 are arranged spaced from one another in two directions (the X-direction and the Y-direction) perpendicular to each other. Internal spaces are provided between the grid stacked bodies 19. The internal spaces function as flow channels for the liquid chemical 200.

Figure 22:
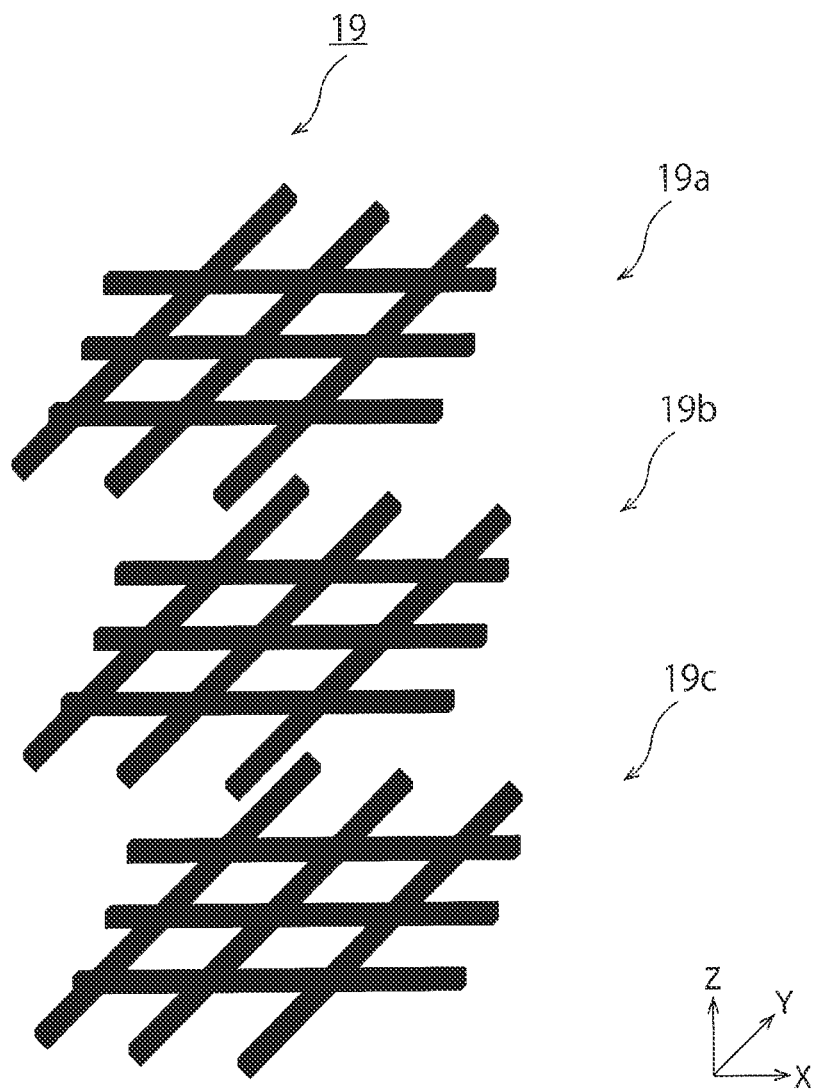
FIG. 22 is an exploded perspective view of a grid stacked body.

FIG. 22 is an exploded perspective view of the grid stacked body 19. In the grid stacked body 19, a plurality of grid bodies 19a to 19c are stacked. Notably, the number of stacking of grid bodies and the number of unit cells therein are not specially limited. Each of the grid bodies 19a to 19c can be formed by weaving thin threads in which noble metal is beforehand supported into a grid shape. Otherwise, it can also be formed by weaving thin threads into a grid shape, and after that, supporting noble metal on the resulting grid body. After that, those grid bodies are stacked, and thereby, the grid stacked body 19 can be formed.

Figure 23:
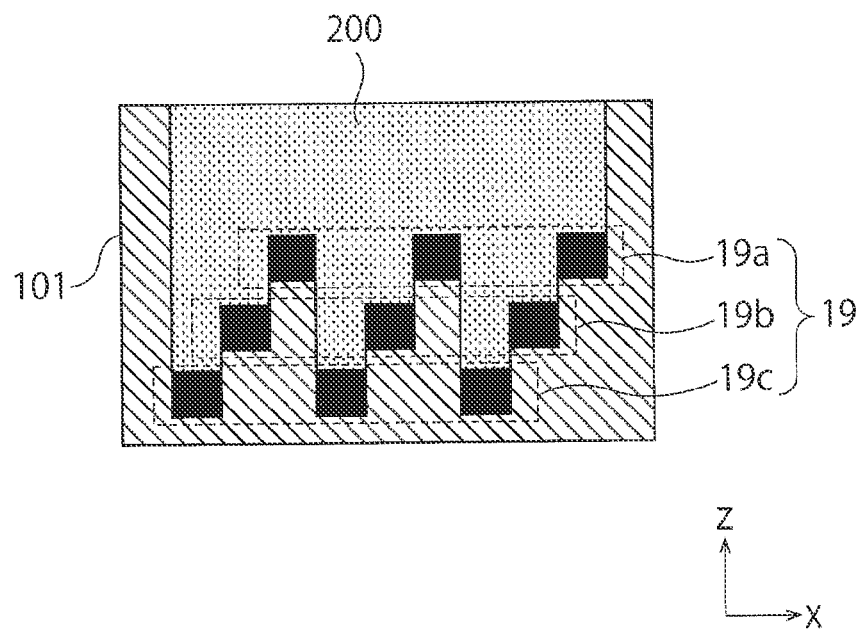
FIG. 23 is a state during an etching treatment in the present embodiment.

FIG. 23 shows a state during an etching treatment in the present embodiment. As shown in FIG. 23, the contact area between the noble metal and the metal film 101 increases by means of the grid stacked body 19 having the grid bodies 19a to 19c stacked. Moreover, liquid permeability for the liquid chemical 200 is secured by means of steps between the grid bodies 19a to 19c. Thereby, the etching rate of the metal film 101 can be enhanced.

Thirteenth Embodiment

Figure 24:
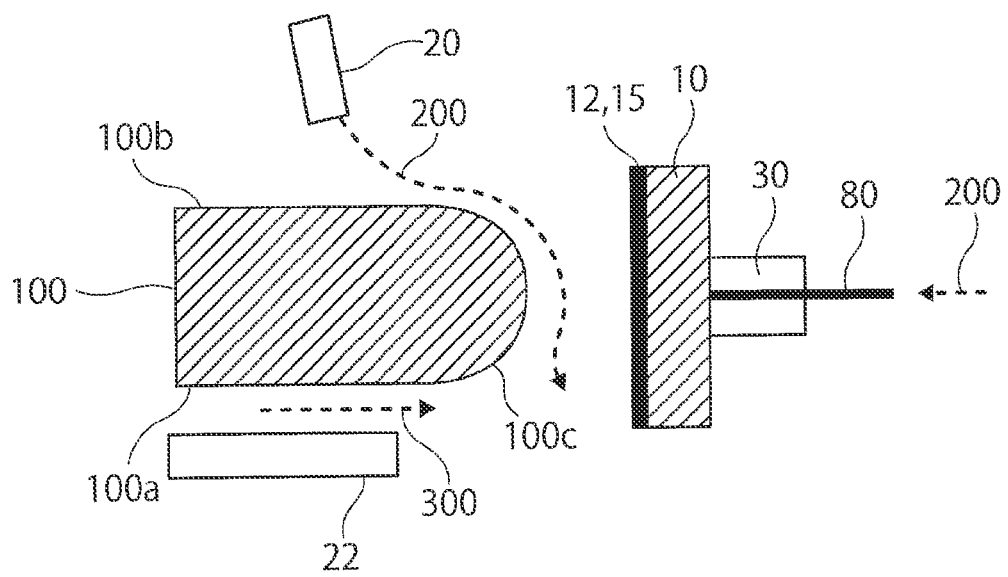
FIG. 24 is a schematic diagram showing a schematic configuration of a substrate treatment apparatus according to a thirteenth embodiment.

FIG. 24 is a schematic diagram showing a schematic configuration of a substrate treatment apparatus according to a thirteenth embodiment. The noble metal-containing member 10 according to the present embodiment has brush shape, such as the above-mentioned hair members 12, 15. This noble metal-containing member 10 can rotate around the substrate 100.

When a bevel part 100c (side surface) of the substrate 100 is processed, as shown FIG. 24, the liquid chemical 200 is supplied to the bevel part 100c from not only the liquid chemical supply nozzle 20 but also the noble metal-containing member 10 through the liquid passing nozzle 80. Then, since a surface 100a (device surface) of the substrate 100 faces downward, the liquid chemical 200 may flow into the surface 100a.

Therefore, in the present embodiment, the liquid chemical 200 is blown away, by blowing a nitrogen ($N_2$) gas from the lower side of the substrate 100, for example. Furthermore, in order to protect the surface 100a, a plate-shaped shield 22 is disposed under the substrate 100.

According to the present embodiment, the substrate 100 can be processed not only its surface 100a but also its back face 100b and bevel part 100c.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A substrate treatment method comprising:
   preparing a substrate having a metal film on a pattern; and
   removing the metal film with etching, by supplying a liquid chemical to the metal film in a state that a noble metal is directly in contact with the metal film, wherein the noble metal is formed on a surface of a porous material, and the noble metal has a periodical concave-convex surface formed at a first pitch, and
   a convex part of the periodical concave-convex surface is in contact with the metal film and a concave part of the periodical concave-convex surface is not in contact with the metal film.

2. The substrate treatment method according to claim 1, wherein
   a surface of the pattern is exposed by removing the metal film with etching.

3. The substrate treatment method according to claim 1, wherein
   the liquid chemical is alkaline.

4. The substrate treatment method according to claim 3, wherein
   the liquid chemical further contains an oxidizing agent.

5. The substrate treatment method according to claim 3, wherein the liquid chemical includes choline, aqueous ammonia or sodium hydroxide.

6. The substrate treatment method according to claim 1, wherein
   the metal film includes tungsten.

7. The substrate treatment method according to claim 1, wherein
   the pattern includes a stacked body including conductor films including a same metal as that of the metal film and insulator films alternately stacked.

8. The substrate treatment method according to claim 1, wherein
   the metal film is etched by galvanic corrosion.

9. The substrate treatment method according to claim 1, wherein
   the noble metal includes at least any of platinum (Pt), gold (Au), silver (Ag) and palladium (Pd).

10. The substrate treatment method according to claim 1, wherein the first pitch is larger than a height of the periodical concave-convex surface.

11. The substrate treatment method according to claim 1, wherein a width of the porous material is smaller than a width of the substrate.

* * * * *